(12) United States Patent
Kauzlarich et al.

(10) Patent No.: US 6,855,204 B2
(45) Date of Patent: Feb. 15, 2005

(54) HIGH YIELD METHOD FOR PREPARING SILICON NANOCRYSTALS WITH CHEMICALLY ACCESSIBLE SURFACES

(75) Inventors: Susan M. Kauzlarich, Davis, CA (US); Richard K. Baldwin, Davis, CA (US)

(73) Assignee: Evergreen Solar Inc., Marlborough, MA (US)

( * ) Notice: Subject to any disclaimer, the term of this patent is extended or adjusted under 35 U.S.C. 154(b) by 80 days.

(21) Appl. No.: 10/247,757

(22) Filed: Sep. 19, 2002

(65) Prior Publication Data

US 2003/0131786 A1 Jul. 17, 2003

Related U.S. Application Data

(60) Provisional application No. 60/323,285, filed on Sep. 19, 2001.

(51) Int. Cl.[7] .............................................. C30B 25/04
(52) U.S. Cl. ............................ 117/89; 117/84; 117/88; 977/DIG. 1
(58) Field of Search .............................. 117/84, 88, 89

(56) References Cited

U.S. PATENT DOCUMENTS

| | | | |
|---|---|---|---|
| 4,594,229 A | 6/1986 | Ciszek et al. | |
| 4,627,887 A | 12/1986 | Sachs | |
| 4,661,200 A | 4/1987 | Sachs | |
| 4,689,109 A | 8/1987 | Sachs | |
| 5,147,841 A | 9/1992 | Wilcoxon | |
| 5,620,904 A | 4/1997 | Hanoka | |
| 5,741,370 A | 4/1998 | Hanoka | |
| 5,762,720 A | 6/1998 | Hanoka et al. | |
| 5,986,203 A | 11/1999 | Hanoka et al. | |
| 6,090,199 A | 7/2000 | Wallace, Jr. et al. | |
| 6,114,046 A | 9/2000 | Hanoka | |
| 6,146,483 A | 11/2000 | Hanoka et al. | |
| 6,187,448 B1 | 2/2001 | Hanoka et al. | |
| 6,200,383 B1 | 3/2001 | Wallace, Jr. et al. | |
| 6,206,996 B1 | 3/2001 | Hanoka et al. | |
| 6,217,649 B1 | 4/2001 | Wallace, Jr. et al. | |
| 6,278,053 B1 | 8/2001 | Hanoka et al. | |
| 6,320,116 B1 | 11/2001 | Hanoka | |
| 6,353,042 B1 | 3/2002 | Hanoka et al. | |
| 6,479,316 B1 | 11/2002 | Hanoka et al. | |

FOREIGN PATENT DOCUMENTS

| | | |
|---|---|---|
| WO | WO 97/24224 | 7/1997 |
| WO | WO 01/14250 | 3/2001 |
| WO | WO 01/38222 | 3/2001 |

OTHER PUBLICATIONS

Baldwin, R.K. ; Pettigrew, K.A.; Ratai, E.; Augustine, M.P.; and Kauzlarich, S.M.; Chem Commun. 2002, 1882–1823.
Baldwin, R.K.; Pettigrew, K.A.; Carno, J.C.; Power, P.P.; Liu, G.; and Kauzlarich, S.M.; J Am Chem. Soc. 2002, 124, 1150–1151.
Bley, R. A.; Kauzlarich, S. M.; J. Am. Chem. Soc. 1996, 118, 12461–12462.
Bley, R. A.; Kauzlarich, S. M.; Ed Fendler, J. H.; Ed.; Nanopart. Nanostruct. Film Wiley–VCH: Weinheim, Germany, 1998; pp 101–118.

(List continued on next page.)

Primary Examiner—Felisa Hiteshew
(74) Attorney, Agent, or Firm—Proskauer Rose LLP

(57) ABSTRACT

Silicon nanocrystals with chemically accessible surfaces are produced in solution in high yield. Silicon tetrahalide such as silicon tetrachloride ($SiCl_4$) can be reduced in organic solvents, such as 1,2-dimethoxyethane (glyme), with soluble reducing agents, such as sodium naphthalenide, to give halide-terminated (e.g., chloride-terminated) silicon nanocrystals, which can then be easily functionalized with alkyl lithium, Grignard or other reagents to give easily processed silicon nanocrystals with an air and moisture stable surface. The synthesis can be used to prepare alkyl-terminated nanocrystals at ambient temperature and pressure in high yield. The two-step process allows a wide range of surface functionality.

26 Claims, 7 Drawing Sheets

OTHER PUBLICATIONS

Dhas, N. A.; Raj, C. P.; Gedanken, A.; *Chem. Mater.* 1988, 10. 3278.

Fojtik, A.; Henglein, A.; *Chem. Phys. Lett.* 1994, 221, 363–367.

Heath, J., R.; *Science*, 1992, 258, 1131–1133.

Holmes, J. D.; Ziegler, K. J.; Doty, R. C.; Pell, L. E.; Johnston, K. P. Korgel, B. A.; *J. Am. Chem. Soc.* 2001, 123, 3742–3748.

Kornowski, A.; Giersig, M.; Vogel, R.; Chemseddine, A.; Weller, H.; *Adv. Mater.* 1993, 5, 634.

Littau, K. A.; Szajowski, P. J.; Muller, A. J.; Kortan, A.R.; Brus, L. E.; *J. Phys. Chem.* 1993, 97, 1224.

Mayeri, D.; Phillips, B.L.; Augustine, M. P.; Kauzlarich, S. M.; *Chem. Mater.* 2001, 13, 765.

Sweryda–Krawiec, B.; Cassagneau, T.; and Fendler, J.H.; *J. Phys. Chem. B*, 1999, 103, 9524–9529.

Wilcoxon, J. P.; Samara, G. A.; Provencio, P. N.; *Phys. Rev. B* 1999, 60, 2704.

Wilcoxon, J. P.; Samara, G. A.; *Appl. Phys. Lett.* 1999, 74, 3164.

Yang, C.-S.; Bley, R A.; Kauzlarich, S. M.; Lee, H. W. H.; Delgado, G. R.; *J. Am. Chem. Soc.* 1999, 121, 5191.

Yang, C.-S.; Liu, Q.; Kauzlarich, S. M.; Phillips, B.; *Chem. Mater.* 2000, 12, 983.

Zhang, D.; Kolbas, R. M.; Mehta, P.; Singh, A. K.; Lichtenwalner, D. J.; Hsieh, K. Y.; Kingon, A. I. *Mater. Res. Soc. Symp. Proc.,* 1992; 35–40.

PCT/US02/29610 International Search Report Feb. 2, 2003.

HIGH YIELD METHOD FOR PREPARING SILICON NANOCRYSTALS WITH CHEMICALLY ACCESSIBLE SURFACES

RELATED APPLICATIONS

This application claims the benefit of the filing date of U.S. Provisional Patent Application Ser. No. 60/323,285, filed on Sep. 19, 2001, entitled "HIGH YIELD METHOD FOR PREPARING SILICON NANOCRYSTALS WITH CHEMICALLY ACCESSIBLE SURFACES" by Kauzlarich et al, the entirety of which is incorporated herein by reference.

GOVERNMENT RIGHTS

The subject matter described herein was supported in part by NIST Advanced Technology Program, Contract No. 70 NANBOH3028. The U.S. Government has certain rights in this invention.

TECHNICAL FIELD

The invention generally relates to silicon nanocrystals. More particularly, the invention relates to silicon nanocrystals having chemically accessible surfaces and methods of their preparation.

BACKGROUND OF THE INVENTION

There has been relatively little research into the synthesis of silicon nanocrystals via solution methods despite the interesting optical and electronic properties that make them important for future technological applications. Silicon nanocrystals exhibit visible luminescence. The wavelength of the luminescence is proportional to the size of the nanocrystal. Since silicon is an important electronic material with applications ranging from computer chips to photovoltaics, nanoelectronics based on silicon has tremendous potential. In addition, since silicon is a biocompatible element, there are many possible applications in the field of biology and medicine as an inorganic fluoresecent probe, a biosensor, or a drug delivery agent. The largest barrier to the utilization of nanocrystalline silicon is the lack of a high yield synthetic method that gives rise to good quality silicon nanocrystals.

Several possible methods for producing silicon nanoparticles have been attempted. These methods include the gas phase and solution decompostion of silanes, the reactions of silicon Zintl salts with silicon halides as well as the solution reduction of silicon halides by sodium, lithium naphthalenide or hydride reagents or reduction of $Si(OEt)_4$ with sodium. While some of these methods are solution reduction methods, it has been suggested that both high temperatures and pressures achieved by bomb reactions, ultrasonication, or annealing after synthesis are required to generate crystalline silicon. In addition, these techniques often give rise to surface oxide contamination.

SUMMARY OF THE INVENTION

It has now been discovered that crystalline silicon nanoparticles with well-defined crystal facets and chemically accessible surfaces can be produced at ambient temperatures and pressures in a simple one or two-step solution synthesis.

In one aspect, the invention generally features a method for producing silicon nanocrystals. In one embodiment, the method includes the steps of: contacting a silicon halide and a first reducing agent in a first organic solvent to produce halide-terminated silicon nanocrystals; and contacting the halide-terminated silicon nanocrystals and a second reducing agent along with a preselected termination group in a second organic solvent to produce silicon nanocrystals terminated with the preselected termination group. The first and second reducing agents may be identical. The first and second organic solvents may be identical. The second reducing agent may also act as a terminating group.

In another aspect, the invention generally features silicon nanocrystals. In one embodiment, the silicon nanocrystals have a size distribution wherein at least 95% of the silicon nanocrystals are between about 40 nm and about 80 nm and at least 80% of the silicon nanocrystals are between about 50 nm and about 70 nm.

In yet another aspect, the invention generally features a method for producing silicon nanocrystals in high yield. In one embodiment, the method includes the step of reducing a silicon halide with a reducing agent in an organic solvent to produce halide-terminated silicon nanocrystals.

DESCRIPTION

In general, the disclosed method is a two-step synthesis, although a one-step process can be designed for synthesis of nanocrystals terminated with certain functional groups.

Figure 1:
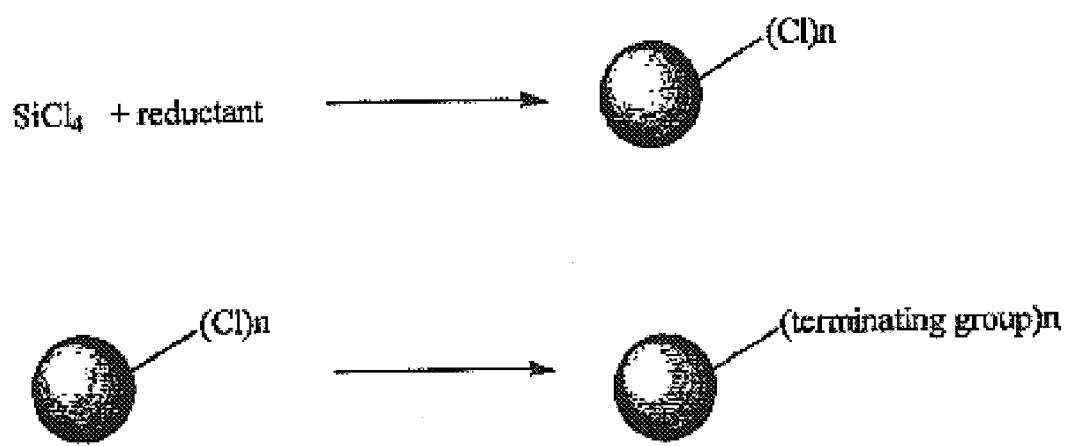
FIG. 1 schematically illustrates one embodiment of synthesis of silicon nanocrystals.

As illustrated in FIG. 1, a silicon tetrahalide such as silicon tetrachloride ($SiCl_4$) is first reduced in an organic solvent with a suitable reductant to produce halide-terminated silicon nanocrystals. The halide-terminated silicon nanocrystals thus obtained can then be functionalized (i.e., terminated) with a desired ligand.

The first step is typically conducted at room temperature and under atmospheric pressure. Any solvent can be used as long as it provides the desired solubility and is inert to the reaction carried out therein. Illustrative examples of such solvents include polyethers such as 1,2-dimethoxyethane (glyme), 2-methoxyethylether (diglyme), triethyleneglycoldimethylether (triglyme) and other polyethers of the form $MeO(CH_2CH_2O)_nMe$. Other illustrative examples of solvents include tetrahydrofuran, 1,4-dioxane, aromatic solvents (e.g., benzene and toluene), and alkanes (e.g., hexane).

Silicon halides that can be used as starting material include where the silicon halide is $SiX_4$, a mixed silicon halide, $R_nSiX_{(4-n)}$, or a mixture thereof, wherein X is a halide, R is an alkyl group, and n=0, 1, 2, or 3. Mixtures of two or more of these halides can also be used. In addition, the disclosed method can also be applied to elements other than silicon such as $EX_4$, where E is any group 4 element and X is a halide. For example, $SiBr_4$ can be reduced with a reductant in a solvent and then the resulting bromine terminated nanocrystal terminated as described below. A mixed silicon halide may also be used in the same synthetic scheme.

Many reductants can be used in the reduction of silicon tetrahalide to silicon ($SiCl_4$ to Si having a potential of –0.24V). Illustrative reducing agents that can be used as the first and/or the second reducing agent include elemental metals such Li, Na, K, Rb, Cs, Mg, Ca, Zn, Al in either bulk or finely divided forms or as a liquid alloy such as Na/K or Hg/Na, Hg/K, Hg/Li, Zn, Al or alkali metals with phase transfer catalysts such as crown ethers; compounds of these metals such as naphthalenides, anthracenides, or acenaphthalenides or other conjugated aromatic anions of Li, Na or K; compounds of these metals such as alkyl lithiums, alkyl aluminiums, alkyl zincs; metal hydrides such as $CaH_2$, KH and NaH or $LiAlH_4$; Grignard reagents, various activated forms of magnesium and other organomagnesium reagents such as magnesium anthracenide. The first and second reducing agents can be different or identical. Furthermore, more than one reducing agent can be used as the first or the second reducing agent.

In the second step, which is also typically conducted at room temperature and under atmospheric pressure, a large number of surface termination groups can be introduced to silicon nanocrystals. For example, the atom connecting to the silicon can be carbon to give hydrocarbon termination, hydrogen to give hydride termination, oxygen to give alkoxide termination, nitrogen to give amine termination, or sulfur or any number of other heteroatoms. Beyond the connecting atom, the nature of the termination group can vary. Any organic or inorganic group can be envisaged including termination groups containing functionality. These functionalities can then be further modified using conventional organic or inorganic chemistry to produce more complex chemical surfaces including oligomeric or polymeric groups.

In one embodiment, the second reducing agent also provides the preselected termination group. For example, an alkyllithium (e.g., n-butyllithium) may be used both as a reducing agent and as a source of alkyl termination groups. Other reducing agents that may provide termination groups include alkoxides (e.g., butoxide) as a source of alkoxide termination groups, anionic amine compounds (e.g., lithium bis(trimethylsilyl)amine) for amino terminating groups, and metal hydrides (e.g., diisobutylaluminium hydride) for hydride terminating groups.

Illustrative examples of alkyl termination include termination by a substituted or unsubstituted alkyl group such as a methyl group, an ethyl group, a propyl group, a butyl group, a pentyl group, and a hexyl group. Illustrative examples of alkoxide termination include termination by a substituted or unsubstituted alkoxy groups such as a methoxy group, an ethoxy group, a propoxy group, a butoxy group, a pentoxy group, and a hexoxy group. Illustrative examples of amine termination include termination by a substituted or unsubstituted amine such as a dimethyl amino group.

In one embodiment, tetrahedral shaped silicon nanocrystals are produced by sodium naphthalenide reduction of silicon tetrachloride in 1,2-dimethoxyethane followed by surface termination with an excess of n-butyllithium. The preferred stoichiometry of the reaction is calculated such that after complete consumption of the sodium, the silicon-:chlorine ratio would be 4:1. Without being bound to the theory, an active Si—Cl surface should be left on the particles formed, which allows surface termination with n-butyllithium. The use of sodium naphthalenide rather than bulk sodium ensures homogeneity of the reaction mixture. Both the $^1H$ and $^{13}C$ NMR spectra displayed broad resonances in a region consistent with the presence of n-butyl groups as well as aromatic resonances due to surface naphthalene moieties.

Hexane solutions of these particles showed no evidence of photoluminesence attributable to silicon nanocrystal quantum confinement. For such effects to be observed, the particles need to be substantially smaller.

Without being bound to the theory, a Wurtz type coupling mechanism can be used to explain the oligimerization of silicon chloride precursors into a nanocrystal. Sodium naphthalenide acts as a soluble and active source of sodium metal. It can exchange alkali metal for halide on silicon. The resulting species can then react with another silicon halide to give a silicon silicon bond. This can explain both the intermolecular formation of Si—Si bonds needed to add an atom to the growing cluster, as well as the intramolecular bond formation required to close the six membered rings of silicon diamond structure.

In one embodiment, more than 80% of the silicon nanocrystals produced are tetrahedral in shape. In another embodiment, more than 90% of the silicon nanocrystals produced are tetrahedral in shape. In yet another embodiment, more than 95% of the silicon nanocrystals produced are tetrahedral in shape. Again, without being bound to the theory, in tetrahedral crystals of a diamond cubic crystal type, the (111) plane must give rise to the facets. For a given single crystal, the most prevalent faces will be those that grow slowest. The face with the greatest surface roughness and largest number of dangling bonds will give rise to the fastest growth, while the smoothest with the least number of dangling bonds will have the slowest face growth and thus be the most prevalent face. In the case of diamond crystalline silicon, choice of facet greatly changes the number of dangling bonds. Cleavage through the (111) plane gives rise to surface silicon atoms with only one dangling bond whereas through other planes surface silicon atoms with more dangling bonds are observed. The slow growth of the (111) plane is consistent with this.

In one embodiment, silicon nanocrystals are produced by the sodium naphthalide reduction of $SiCl_4$, followed by termination with 1-octanol. The particles thus produced have a mean diameter of 5.2±1.2 nm. They are crystalline and faceted in the high resolution TEM. The solution $^1H$ NMR and IR are both consistent with octanoxide groups on the surface. These particles are small enough to exhibit photoluminescence. For an excitation at 320 nm emission is observed in the 410–420 nm range. $^{29}Si\{^1H\}$ CP MAS NMR of these nanocrystals, as well as energy dispersive x-ray spectroscopy confirm the nanocrystals are silicon.

Any solvent may be used in the second step of the synthesis as long as the desired silicon nanocrystals are produced. Illustrative examples of such solvents include polyethers such as 1,2-dimethoxyethane (glyme), 2-methoxyethylether (diglyme), triethyleneglycoldimethylether (triglyme) and other polyethers of the form $MeO(CH_2CH_2O)_nMe$. Other illustrative examples of solvents include tetrahydrofuran, 1,4-dioxane, aromatic solvents (e.g., benzene and toluene), and alkanes (e.g., hexane). In certain embodiments, identical solvent(s) is employed in the first and the second steps. A single or a mixture of solvents may be used in the first and/or the second step of the synthesis.

In one embodiment, the silicon nanocrystals that are produced by the disclosed method typically range from about 1 nm to about 100 nm. The size of the nanocrystals and the size distribution can be controlled. In one detailed embodiment, 95% of the nanocrystals fall within the 1 nm to 80 nm range and 80% fall within 1 nm to 70 nm range. In another detailed embodiment, 80% of the nanocrystals fall within 1 nm to 50 nm range. In yet another detailed embodiment, 80% fall within 1 nm to 10 nm range.

The yield of the silicon nanocrystals is more than 90% and typically is more than 95% by weight of silicon in the starting material. Quantitative transformation from silicon tetrahalide to silicon nanocrystals can also be achieved.

Silicon nanocrystals, such as butyl-terminated silicon nanocrystals, prepared according to the disclosed method are free from surface contamination and are air and moisture stable. In one embodiment, silicon nanocrystals prepared are stable at ambient air and moisture conditions for at least one day. In another embodiment, silicon nanocrystals prepared are stable at ambient air and moisture conditions for at least one week.

In one embodiment, the synthesis can be completed in a single step. For example, a mixture of $R_nSiX_{(4-n)}$ (e.g., t-BuSiCl$_3$) and $SiX_4$ (e.g., $SiCl_4$), where R is an alkyl group, X is a halide, and n is 0, 1, 2, or 3, can be reduced in a solvent with a reductant. The already substituted t-BuSiCl$_3$ provides the termination groups on reduction while the $SiCl_4$ provides the crystalline core of the silicon nanocrystal on reduction.

The advantages of the disclosed method over the current state of the art include the chemical accessibility of the chloride termination, allowing easy access to different terminating groups, as silicon-chloride bonds can easily be replaced by silicon-other element bonds. The advantages also include reaction conditions of ambient temperature and pressure, the easy increase in scale, and the ability to control the yield of the silicon nanocrystals formed. The flexible nature of the synthetic procedure also allows control of the size and shape of the nanocrystals formed. For instance, reduction of $SiCl_4$ with sodium naphthalenide followed by termination with BuLi generates large tetrahedral silicon nanocrystals while reduction of silicon tetrachloride with sodium naphthalenide followed by termination with octanol gives rise to substantially smaller silicon nanocrystals of less well defined shape. The silicon halide starting material, especially silicon tetrachloride, is relatively inexpensive and readily available. In addition, such an easily manipulated solution route allows preparation of doped silicon nanocrystals as a great variety of potential dopants can be readily introduced in a solution.

EXAMPLES

The following examples are provided to further illustrate and to facilitate the understanding of the invention. These specific examples are intended to be illustrative of the invention. Two examples of the solution reduction methods at ambient temperature and pressure for the production of silicon nanocrystals are described here.

Example 1

A tetrahydrofuran solution of sodium naphthalenide (0.9 g, 39 mmol Na and 3.23 g, 25 mmol of naphthalene in 30 cm$^3$ tetrahydrofuran stirred for three hours) was added rapidly at room temperature via cannula to a 500 cm$^3$ Schlenk flask containing 300 cm$^3$ of 1,2-dimethoxyethane and 1.14 g, 6.7 mmol of $SiCl_4$ with rapid stirring. On completion of the naphthalenide addition a large excess of n-butyllithium (10 cm$^3$, 1.6M in hexane) was added immediately. The solvent was removed under vacuum from the resulting yellow brown suspension. The residue was extracted with hexane and washed with water to remove sodium and lithium salts. Evaporation of the hexane layer followed by heating under vacuum to remove residual naphthalene gave 0.7 g of a viscous yellow oil.

Figure 2:
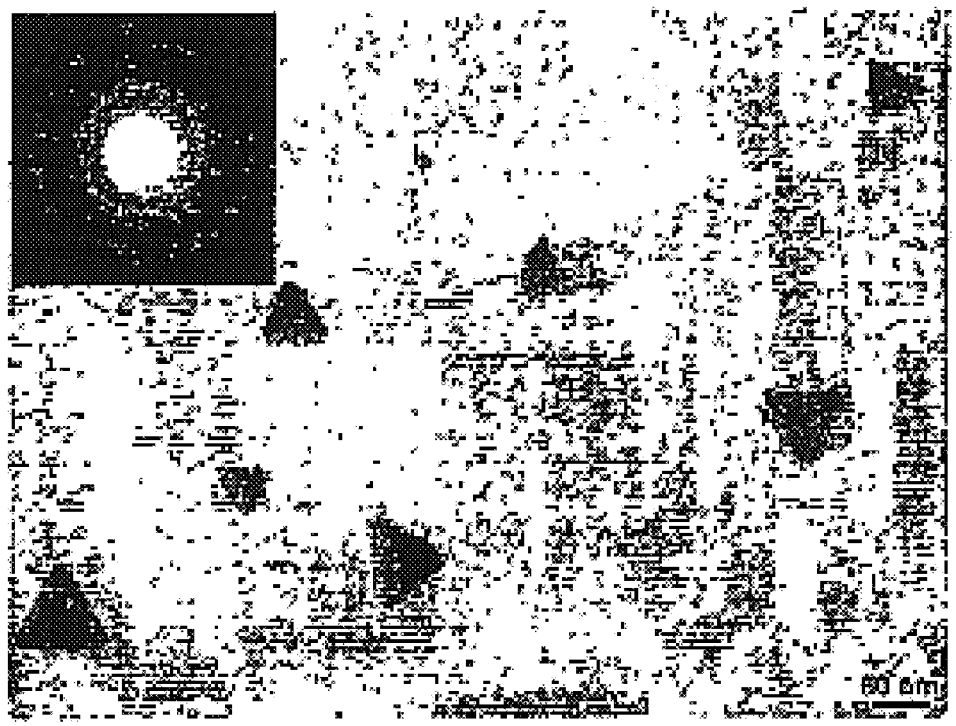
FIG. 2 shows transmission electron microscope and selected area electron diffraction images of silicon nanocrystals synthesized according to an embodiment of the invention.

Transmission electron microscopy (TEM) shows the presence of crystalline silicon tetrahedra of approximately 60 nm in edge length. The bright-field TEM image of a number of the silicon nanocrystals on a holey carbon grid, along with the selected area electron diffraction (SAED) pattern is given in FIG. 2. In FIG. 2, darkness is relative to electron beam opacity of the sample. To prepare the TEM grids the sample was diluted approximately 100 fold in hexane and sonicated to resuspend the nanocrystals. A 20 $\mu$L aliquot of this solution is dropped on a holey carbon grid which was then dried in an oven at 120° C. for 1 h. The dark triangular shapes are the silicon nanocrystals. The particles are faceted with tetrahedral morphology. The SAED (inset in the top left of FIG. 2) spot pattern is consistent with the silicon diamond lattice. A survey of fifty-five particles from several different areas on the grid gave edge lengths between 40 and 130 nm with 95% of the particles falling within the 40–80 nm range and 80% falling within the 50–70 nm range.

Figure 3:
FIG. 3 shows scanning electron microscope and transmission electron microscope images of a silicon nanocrystal synthesized according to an embodiment of the invention.
Figure 4:
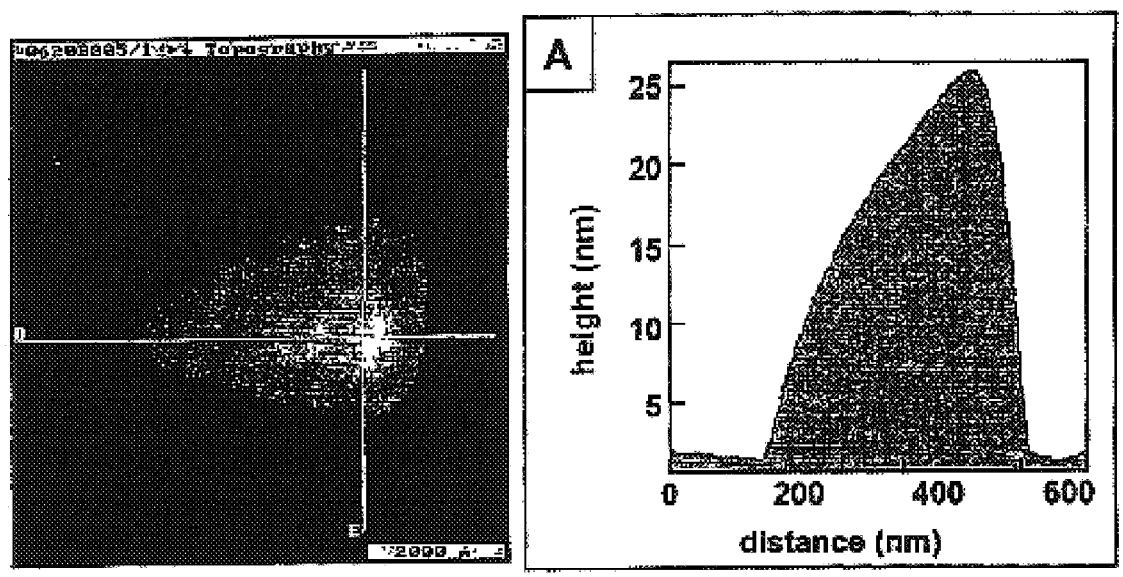
FIG. 4 shows an atomic force microscope image of a silicon nanocrystal synthesized according to an embodiment of the invention.

Solution NMR spectroscopy of the resulting yellow oil was consistent with surface alkyl termination. This is also confirmed by scanning electron microscopy (SEM), FIG. 3, which shows larger SEM image than those in TEM, consistent with the nanocrystals being covered with an organic layer that images in the SEM but does not image in the TEM. In FIG. 3, the left image is a SEM image of a silicon nanocrystal while the right image is the TEM image of the same nanocrystal at the same magnification. It can be seen that the TEM image is much smaller than the SEM image. The three-dimensional geometry of the silicon nanocrystals are confirmed by atomic force microscopy (AFM). FIG. 4 shows an AFM topograph of a typical nanocrystal.

Example 2

Figure 5:
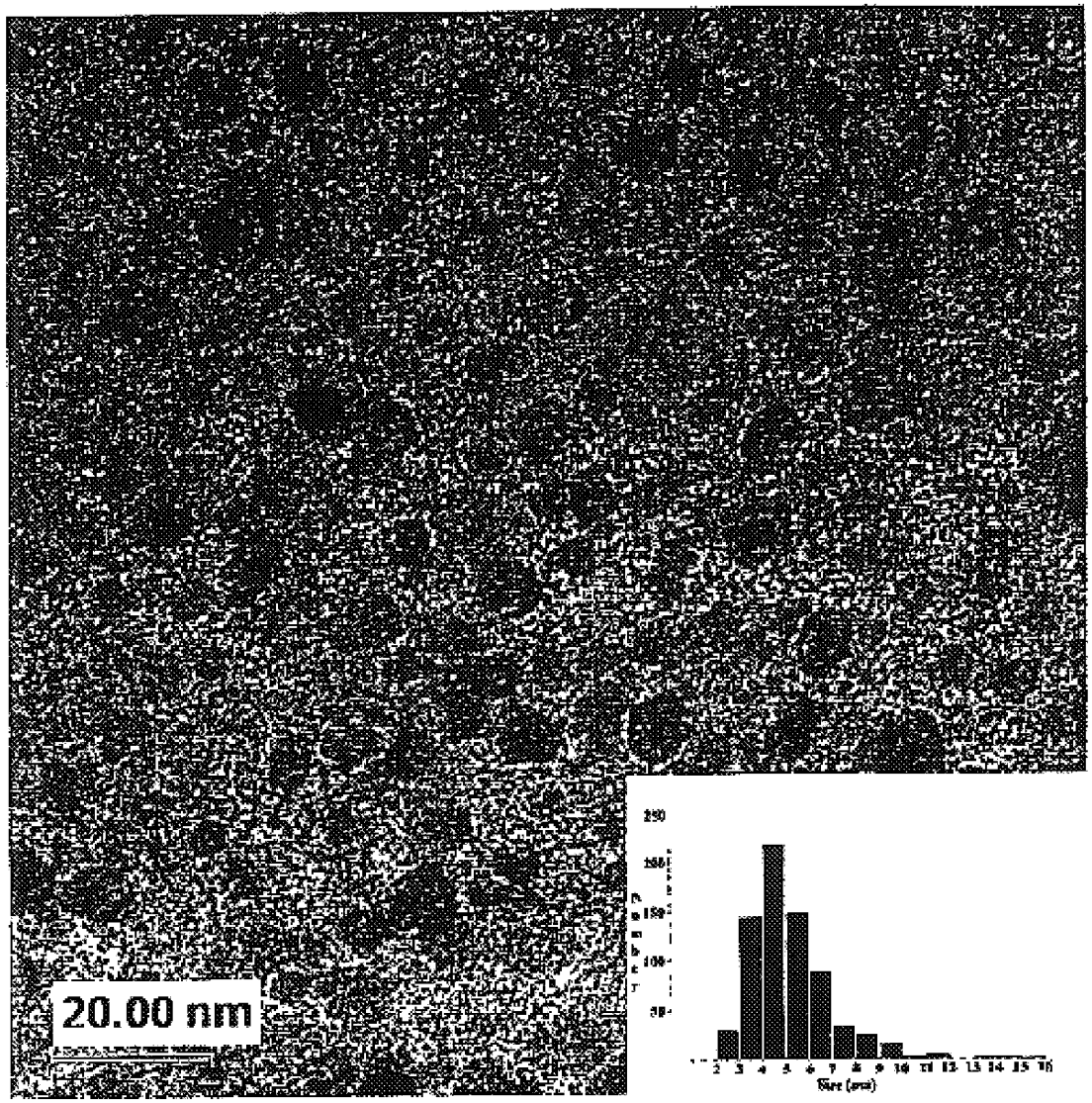
FIG. 5 shows a high resolution transmission electron microscope image of silicon nanocrystals synthesized according to an embodiment of the invention.
Figure 6:
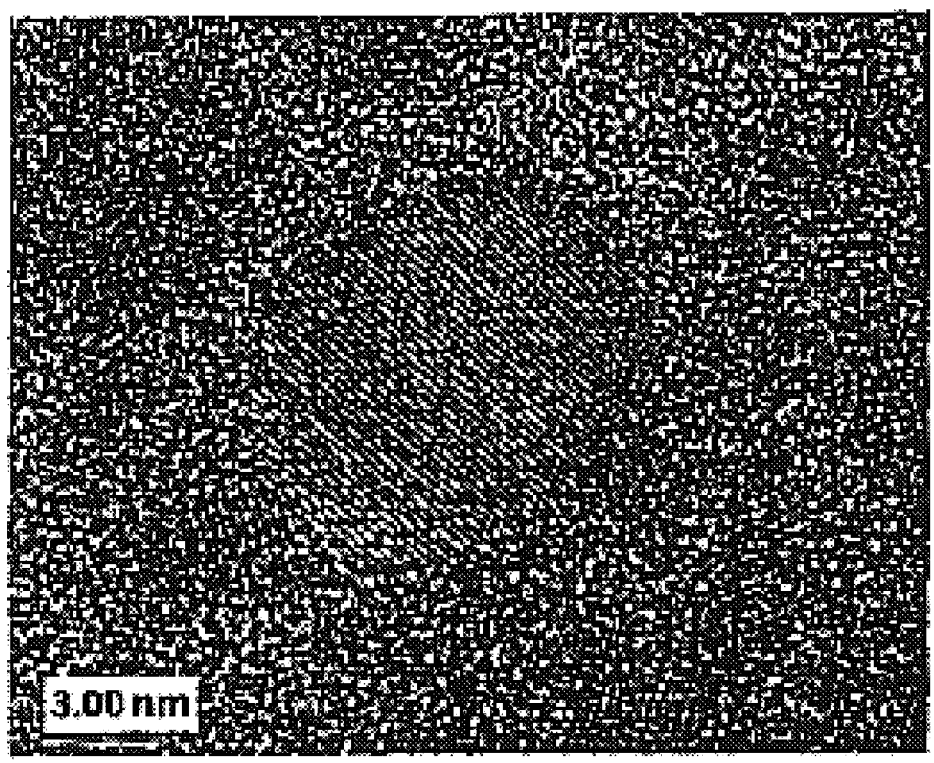
FIG. 6 shows a high resolution transmission electron microscope image of silicon nanocrystals synthesized according to an embodiment of the invention.
Figure 7:
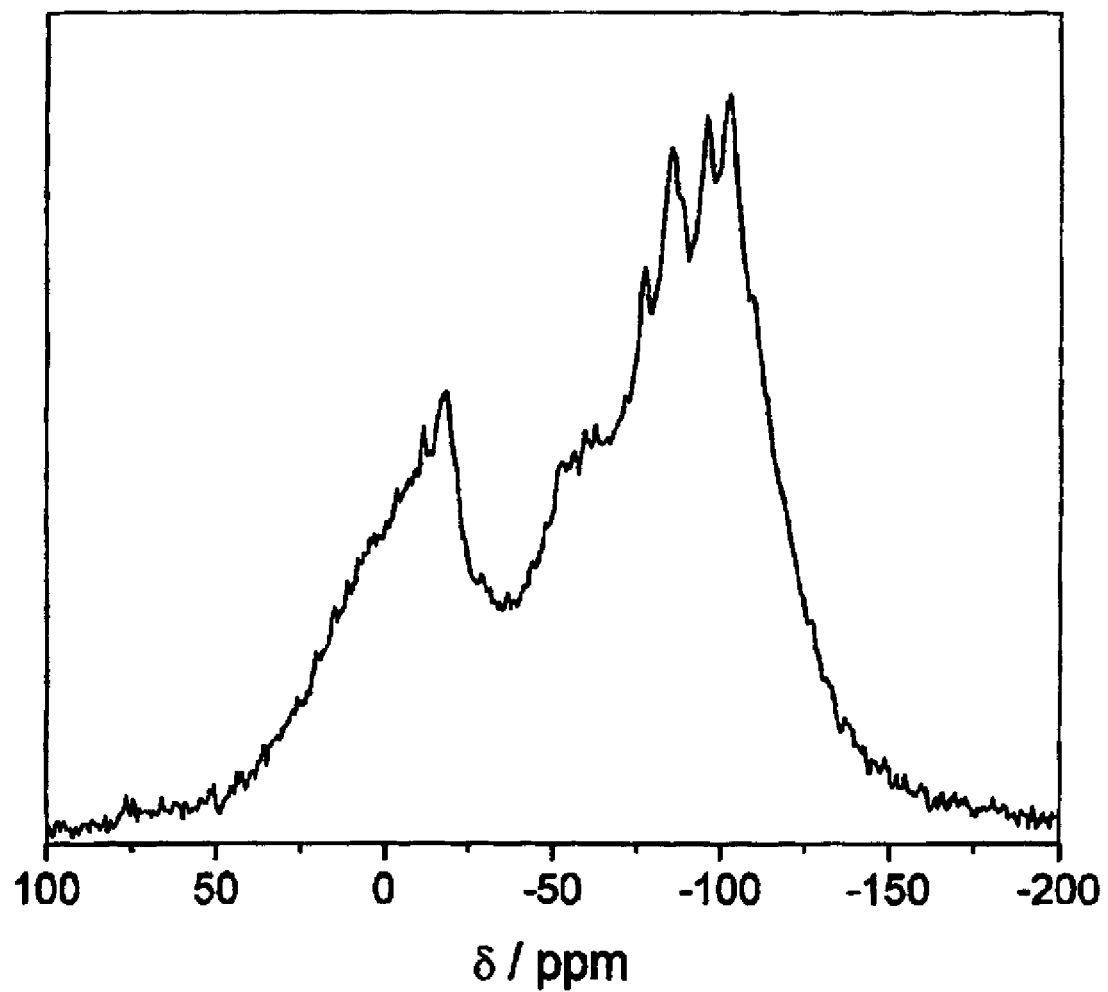
FIG. 7 shows a $^{29}Si\{^1H\}$ CP MAS NMR of silicon nanocrystals synthesized according to an embodiment of the invention.

Sodium naphthalenide, prepared from sodium (0.69 g) and nanphthalene (2.39 g) stirred in 70 cm$^3$ of 1,2-dimethoxyethane overnight, was added rapidly via cannula to a stirred solution of 1.04 g of $SiCl_4$ in 1,2-dimethoxyethane. The dark brown suspension obtained was stirred for a further 30 minutes then 5 cm$^3$ of 1-octanol was added. A yellow solution with a white precipitate was observed immediately. The solvent and naphthalene were removed immediately with heating in a water bath. The resulting orange solid was extracted with hexane and washed three times with slightly acidic distilled water. The hexane layer was collected and pumped down to give a waxy orange hexane soluble solid. Solution $^1$H NMR was consistent with octanoxide groups on the surface of the nanocrystals. This was also supported by the IR spectrum in which a Si—OR stretch was observed at ~1080 cm$^{-1}$ and an alkyl C—H stretch at 3000 cm$^{-1}$. The nanocrystals Holey carbon grids for TEM were prepared by suspending the nanocrystals in hexane with ultrasonication, then dipping the grid into the suspension thus obtained and then allowing the solvent to evaporate. FIG. 5 gives a high resolution TEM image of an area on the grid along with a histogram of sizes. The dark spots are nanocrystals. The mean diameter of the observed particles was found to be 5.2±1.9 nm from a survey of 718 nanocrystals. FIG. 6 gives a high resolution image of a large silicon nanocrystal. The particle is crystalline and faceted. The lattice fringes of the particle are clearly visible, the spacing of 0.314 nm consistent with the <111> plane of diamond crystalline silicon. Energy dispersive x-ray spectroscopy also confirms the presence of silicon, as does solid state $^{29}Si\{^{1}H\}$ CP MAS NMR (FIG. 7).

Example 3

Magnesium powder (0.47 g) was suspended with sonication in 70 cm$^3$ of dry 1,2-dimethoxyethane. To this was added 1.18 cm$^3$ of SiCl$_4$ and the resulting suspension sonicated overnight. To the red/brown solution and gray precipitate thus obtained was added 2 cm$^3$ of 20% MgBuCl in tetrahydrofuran. The solvent and any other volatiles were removed under vacuum, the resulting colorless oil taken up in hexane, washed with slightly acidified water and again pumped down to a colorless oil. The oil contained small silicon nanoparticles by TEM (<20 nm). $^1$H NMR and IR confirmed the existence of terminating butyl groups.

Example 4

Naphthalene (3.061 g) and sodium (0.8 g) were stirred in 60 cm$^3$ of dry 1,2-dimethoxyethane for 2 days. The mixture was then added to a solution of 0.58 g of SiCl$_4$ and 0.65 g of t-BuSiCl$_3$ in 300 cm$^3$ of 1,2-dimethoxyethane at 0° C. over a period of three minutes. A deep yellow/brown solution was obtained. Glyme and naphthalene were removed under reduced pressure and the resulting oil extracted with hexane. $^1$H NMR was consistent with the presence of terminating t-butyl groups while the TEM showed crystalline silicon nanoparticles of a range of sizes.

Variations, modifications, and other implementations of what is described herein will occur to those of ordinary skill in the art without departing from the spirit and the scope of the invention. Accordingly, the invention is not to be limited only to the preceding illustrative descriptions.

What is claimed is:

1. A method for producing silicon nanocrystals comprising the steps of:
    contacting a silicon halide and a first reducing agent in a first organic solvent to produce halide-terminated silicon nanocrystals; and
    contacting the halide-terminated silicon nanocrystals and a second reducing agent along with a preselected termination group in a second organic solvent to produce silicon nanocrystals terminated with the preselected termination group,
    wherein at least one of the first and second reducing agents is an elemental metal having an oxidation potential greater than 0.24V and the elemental metal is in finely divided form.

2. A method for producing silicon nanocrystals comprising the steps of:
    contacting a silicon halide and a first reducing agent in a first organic solvent to produce halide-terminated silicon nanocrystals; and
    contacting the halide-terminated silicon nanocrystals and a second reducing agent along with a preselected termination group in a second organic solvent to produce silicon nanocrystals terminated with the preselected termination group,
    wherein at least one of the first and second reducing agents comprises a liquid alloy comprising one metal component that has an oxidation potential greater than 0.24V.

3. The method of claim 2 wherein at least one of the first and the second reducing agents comprises an agent selected from the group consisting of Na/K, Hg/Na, Hg/K, Hg/Li, Hg/Zn, and Hg/Al.

4. A method for producing silicon nanocrystals comprising the steps of:
    contacting a silicon halide and a first reducing agent in a first organic solvent to produce halide-terminated silicon nanocrystals; and
    contacting the halide-terminated silicon nanocrystals and a second reducing agent along with a preselected termination group in a second organic solvent to produce silicon nanocrystals terminated with the preselected termination group,
    wherein at least one of the first and second reducing agents comprises a mixture of an alkali metal and a phase transfer catalyst.

5. The method of claim 4 wherein the phase-transfer catalyst is a crown ether.

6. The method as in claims 1, 2, or 4 wherein at least one of the first and second reducing agents comprises an aromatic anion, an alkyl metal compound, or a metal hydride of a metal selected from the group consisting of Li, Na, K, Mg, Ca, Zn, and Al.

7. The method as in claims 1, 2, or 4 wherein at least one of the first and second reducing agents comprises an activated magnesium reagent.

8. A method for producing silicon nanocrystals comprising the steps of:
    contacting a silicon halide and a first reducing agent in a first organic solvent to produce halide-terminated silicon nanocrystals; and
    contacting the halide-terminated silicon nanocrystals and a second reducing agent along with a preselected termination group in a second organic solvent to produce silicon nanocrystals terminated with the preselected termination group,
    wherein the first and second reducing agents are the same.

9. The method in claims 1, 2, 4, or 8 wherein at least one of the first and second organic solvents comprise a polyether having a formula of MeO(CH$_2$CH$_2$O)$_n$Me.

10. The method of claim 9 wherein the polyether is selected from the group consisting of 1,2-dimethoxyethane (glyme), 2-methoxyethylether (diglyme), and triethyleneglycoldimethylether (triglyme).

11. The method as in claims 1, 2, 4, or 8 wherein at least one of the first and second organic solvents comprises tetrahydrofuran, 1,4-dioxane, benzene, toluene, or hexane.

12. The method as in claims 1, 2, 4, or 8 wherein the first and second organic solvents are the same.

13. The method as in claims 1, 2, 4, or 8 wherein the preselected termination group comprises an alkyl termination group, a hydride termination group, an alkoxy termination group, an amino termination group, or a mixture thereof.

14. A method for producing silicon nanocrystals comprising the steps of:
    contacting a silicon halide and a first reducing agent in a first organic solvent to produce halide-terminated silicon nanocrystals; and
    contacting the halide-terminated silicon nanocrystals and a second reducing agent along with a preselected termination group in a second organic solvent to produce silicon nanocrystals terminated with the preselected termination group, wherein the preselected termination group comprises an alkyl termination group, a hydride termination group, an alkoxy termination group, an amino termination group, or a mixture thereof and is an oligomeric or polymeric group.

15. The method as in claims 1, 2, 4, 8, or 14 wherein at least 95% of the silicon nanocrystals have a length between about 1 nm to about 80 nm and at least 80% of the silicon nanocrystals have a length between about 1 nm to about 70 nm.

16. The method as in claims 1, 2, 4, 8, or 14 wherein at least 95% of the silicon nanocrystals have a length between about 40 nm to about 80 nm and at least 80% of the silicon nanocrystals have a length between about 50 nm to about 70 nm.

17. The method as in claims 1, 2, 4, 8, or 14 wherein at least 80% of the silicon nanocrystals have a length between about 1 nm and about 50 nm.

18. The method as in claims 1, 2, 4, 8, or 14 wherein at least 80% of the silicon nanocrystals have a length between about 1 nm and about 10 nm.

19. The method as in claims 1, 2, 4, 8, or 14 wherein at least one of the steps of contacting a silicon halide and a first reducing agent in a first organic solvent and contacting the halide-terminated silicon nanocrystals and a second reducing agent along with a preselected termination group is carried out at ambient temperature and pressure.

20. The method as in claims 1, 2, 4, 8, or 14 wherein both steps of contacting a silicon halide and a first reducing agent in a first organic solvent and contacting the halide-terminated silicon nanocrystals and a second reducing agent along with a preselected termination group are carried out at ambient temperature and pressure.

21. The method as in claims 1, 2, 4, 8, or 14 wherein the steps of contacting a silicon halide and a first reducing agent in a first organic solvent and contacting the halide-terminated silicon nanocrystals and a second reducing agent along with a preselected termination group are carried out concurrently in one reaction.

22. The method as in claims 1, 2, 4, 8, or 14 wherein the yield of silicon nanocrystals is greater than 90% by weight of silicon in the silicon halide.

23. The method as in claims 1, 2, 4, 8, or 14 wherein the second reducing agent provides the preselected termination group.

24. The method of claim 23 wherein the second reducing agent is alkyllithium and the preselected termination group is an alkyl group.

25. The method of claim 24 wherein the alkyllithium is n-butyllithium.

26. The method of claim 23 wherein the second reducing agent comprises a metal alkoxide, an anionic amine, or a metal hydride.

* * * * *